United States Patent
Henley

(10) Patent No.: US 9,336,989 B2
(45) Date of Patent: May 10, 2016

(54) METHOD OF CLEAVING A THIN SAPPHIRE LAYER FROM A BULK MATERIAL BY IMPLANTING A PLURALITY OF PARTICLES AND PERFORMING A CONTROLLED CLEAVING PROCESS

(71) Applicant: Silicon Genesis Corporation, San Jose, CA (US)

(72) Inventor: Francois J. Henley, Aptos, CA (US)

(73) Assignee: SILICON GENESIS CORPORATION, Santa Clara, CA (US)

(*) Notice: Subject to any disclaimer, the term of this patent is extended or adjusted under 35 U.S.C. 154(b) by 0 days.

(21) Appl. No.: 13/766,522

(22) Filed: Feb. 13, 2013

(65) Prior Publication Data

US 2013/0209740 A1    Aug. 15, 2013

Related U.S. Application Data

(60) Provisional application No. 61/598,283, filed on Feb. 13, 2012.

(51) Int. Cl.
| | |
|---|---|
| *C30B 33/04* | (2006.01) |
| *H01J 37/31* | (2006.01) |
| *C30B 29/20* | (2006.01) |
| *C30B 33/06* | (2006.01) |

(52) U.S. Cl.
CPC ............. *H01J 37/31* (2013.01); *C30B 29/20* (2013.01); *C30B 33/04* (2013.01); *C30B 33/06* (2013.01); *Y10T 156/1052* (2015.01); *Y10T 428/24479* (2015.01); *Y10T 428/31515* (2015.04)

(58) Field of Classification Search
CPC .............. H01L 21/02; H01L 21/02002; H01L 21/02005; H01L 21/02104; H01L 21/02697; C30B 33/00; C30B 33/04; C30B 33/06
USPC .......... 117/2–3, 902, 915, 922, 950; 264/430, 264/446, 488; 438/795, 798
See application file for complete search history.

(56) References Cited

U.S. PATENT DOCUMENTS

| | | | |
|---|---|---|---|
| 5,362,682 A * | 11/1994 | Bozler | .................... C30B 25/04 117/101 |
| 5,985,742 A | 11/1999 | Henley et al. | |
| 6,010,579 A | 1/2000 | Henley et al. | |

(Continued)

OTHER PUBLICATIONS

Abbas Azhdari et al., "Experimental and computational study of fracturing in an anisotropic brittle solid", Mechanics of Materials, 1998, vol. 28, pp. 247-262, Elsevier Science Ltd.

(Continued)

*Primary Examiner* — Kenneth A Bratland, Jr.

(57) ABSTRACT

Embodiments relate to use of a particle accelerator beam to form thin layers of material from a bulk substrate. In particular embodiments, a bulk substrate (e.g. donor substrate) having a top surface is exposed to a beam of accelerated particles. In certain embodiments, this bulk substrate may comprise a core of crystalline sapphire ($Al_2O_3$) material. Then, a thin layer of the material is separated from the bulk substrate by performing a controlled cleaving process along a cleave region formed by particles implanted from the beam. Embodiments may find particular use as hard, scratch-resistant covers for personal electric device displays, or as optical surfaces for fingerprint, eye, or other biometric scanning.

14 Claims, 6 Drawing Sheets

(56) References Cited

U.S. PATENT DOCUMENTS

| | | | |
|---|---|---|---|
| 6,013,563 A * | 1/2000 | Henley | B81C 1/0038 257/E21.088 |
| 6,033,974 A | 3/2000 | Henley et al. | |
| 6,083,324 A | 7/2000 | Henley et al. | |
| 6,103,599 A | 8/2000 | Henley et al. | |
| 6,171,965 B1 | 1/2001 | Kang et al. | |
| 6,184,111 B1 | 2/2001 | Henley et al. | |
| 6,187,110 B1 | 2/2001 | Henley et al. | |
| 6,248,649 B1 | 6/2001 | Henley et al. | |
| 6,265,328 B1 | 7/2001 | Henley et al. | |
| 6,290,804 B1 | 9/2001 | Henley et al. | |
| 6,291,314 B1 | 9/2001 | Henley et al. | |
| 6,291,326 B1 | 9/2001 | Henley et al. | |
| 6,335,264 B1 | 1/2002 | Henley et al. | |
| 6,448,152 B1 | 9/2002 | Henley et al. | |
| 6,455,399 B2 | 9/2002 | Malik et al. | |
| 6,458,672 B1 | 10/2002 | Henley et al. | |
| 6,458,723 B1 | 10/2002 | Henley et al. | |
| 6,486,008 B1 * | 11/2002 | Lee | H01L 21/76254 257/E21.568 |
| 6,528,391 B1 | 3/2003 | Henley et al. | |
| 6,582,999 B2 | 6/2003 | Henley et al. | |
| 6,881,644 B2 | 4/2005 | Malik et al. | |
| 6,890,838 B2 | 5/2005 | Henley et al. | |
| 6,969,668 B1 | 11/2005 | Kang et al. | |
| 7,253,081 B2 | 8/2007 | Kang et al. | |
| 7,470,600 B2 | 12/2008 | Henley et al. | |
| 7,759,220 B2 | 7/2010 | Henley | |
| 7,781,305 B2 | 8/2010 | Henley et al. | |
| 7,811,900 B2 | 10/2010 | Henley | |
| 7,863,157 B2 | 1/2011 | Henley et al. | |
| 7,910,458 B2 | 3/2011 | Henley | |
| 7,998,273 B2 * | 8/2011 | Scholz | C30B 25/02 117/100 |
| 8,012,852 B2 | 9/2011 | Henley et al. | |
| 8,110,480 B2 | 2/2012 | Henley | |
| 8,124,499 B2 | 2/2012 | Henley et al. | |
| 8,294,730 B2 | 10/2012 | Tremblay | |
| 8,993,410 B2 | 3/2015 | Henley et al. | |
| 2002/0081823 A1 | 6/2002 | Cheung et al. | |
| 2002/0090758 A1 | 7/2002 | Henley et al. | |
| 2003/0019564 A1 * | 1/2003 | Shimada | C04B 41/009 156/89.11 |
| 2005/0247668 A1 | 11/2005 | Malik et al. | |
| 2007/0029043 A1 | 2/2007 | Henley | |
| 2007/0235074 A1 * | 10/2007 | Henley | H01L 31/0232 136/252 |
| 2008/0128641 A1 | 6/2008 | Henley et al. | |
| 2008/0179547 A1 * | 7/2008 | Henley | H01L 21/76254 250/492.21 |
| 2008/0206962 A1 | 8/2008 | Henley et al. | |
| 2009/0206275 A1 | 8/2009 | Henley et al. | |
| 2009/0277314 A1 | 11/2009 | Henley | |
| 2010/0055874 A1 | 3/2010 | Henley | |
| 2012/0119224 A1 * | 5/2012 | Tai | H01L 21/02002 257/77 |
| 2013/0209740 A1 | 8/2013 | Henley | |
| 2013/0236699 A1 | 9/2013 | Prest et al. | |
| 2013/0292691 A1 | 11/2013 | Henley et al. | |
| 2014/0133074 A1 | 5/2014 | Zahler et al. | |

OTHER PUBLICATIONS

"iPhone 4—Technical Specifications", Apple Online Store, 2015, pp. 1-4, Apple Inc., https://support.apple.com/kb/sp587?locale=en_US.

* cited by examiner

| Core Dia. | Area (cm2) | Cleave Cost |
|---|---|---|
| 2" | 20 | $ 1.00 |
| 3" | 46 | $ 2.25 |
| 4" | 81 | $ 4.00 |
| 6" | 182 | $ 9.00 |
| 8" | 324 | $12 to $18 |
| 12" | 730 | $20 to $45 |

FIG. 5

METHOD OF CLEAVING A THIN SAPPHIRE LAYER FROM A BULK MATERIAL BY IMPLANTING A PLURALITY OF PARTICLES AND PERFORMING A CONTROLLED CLEAVING PROCESS

CROSS-REFERENCES TO RELATED APPLICATIONS

This application claims priority to U.S. Provisional Application No. 61/598,283, filed Feb. 13, 2012, commonly owned, incorporated by reference herein for all purposes.

BACKGROUND OF THE INVENTION

Embodiments of the present invention relate generally to techniques including methods and apparatuses for forming layers from a bulk material. Certain embodiments may employ an accelerator process for the manufacture of films in a variety of applications calling for a hard, scratch-resistant surface exhibiting transparency to incident light, including but not limited to camera lens covers, personal electric device display covers, and fingerprint or eye biometric scan optical surfaces. But it will be recognized that the invention has a wider range of applicability; it can also be applied to optoelectronic devices such as light emitting diodes (LEDs) and semiconductor lasers, three-dimensional packaging of integrated semiconductor devices, photonic or photovoltaic devices, piezoelectronic devices, flat panel displays, microelectromechanical systems ("MEMS"), nano-technology structures, sensors, actuators, integrated circuits, biological and biomedical devices, and the like. It can also be used as a protective laminate offering protection in harsh chemical and temperature environments.

Certain embodiments may include methods and apparatuses for cleaving films from material in bulk form, such as sapphire, silicon carbide (SiC) or GaN ingots or cores. Conventionally, such films can be manufactured by techniques involving the sawing of bulk material. One example of sawing involves the use of a wire ("wiresaw").

However, such materials suffer from material losses during conventional saw manufacturing called "kerf loss", where the sawing process eliminates as much as 40% and even up to 60% of the starting material in singulating the material from a core or boule into an individual layer. This is an inefficient method of preparing films from expensive starting materials. The brittle and hard nature of many of these materials makes the manufacture of large area thin layers particularly challenging.

From the above, it is seen that techniques for forming suitable substrate materials of high quality and low cost are highly desired. Cost-effective and efficient techniques for the manufacture of hard, scratch-resistant films are also desirable.

BRIEF SUMMARY OF THE INVENTION

Embodiments relate to use of a particle accelerator beam to form thin layers of material from a bulk substrate. In particular embodiments, a bulk substrate (e.g. donor substrate) having a top surface is exposed to a beam of accelerated particles. In certain embodiments, this bulk substrate may comprise a core of crystalline sapphire ($Al_2O_3$) material. Then, a thin layer of the material is separated from the bulk substrate by performing a controlled cleaving process along a cleave region formed by particles implanted from the beam. Embodiments may find particular use as hard, scratch-resistant covers for personal electric device displays, or as optical surfaces for fingerprint, eye, or other biometric scanning.

BRIEF DESCRIPTION OF THE DRAWINGS

FIG. 5 is a table showing estimated cost of cleaving as a function of a diameter of a sapphire core.

DETAILED DESCRIPTION OF THE INVENTION

Figure 1:
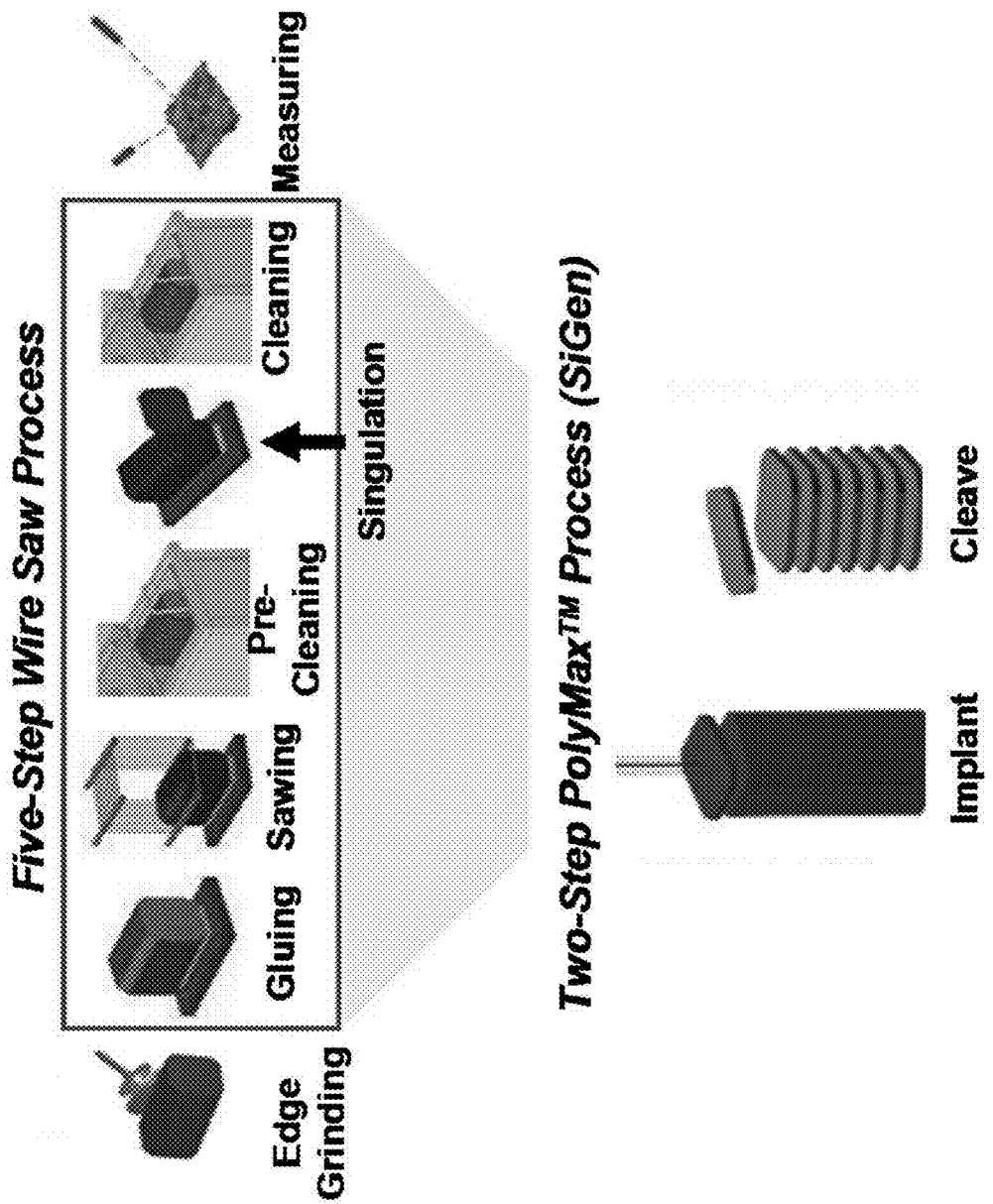
FIG. 1 is a simplified process flow illustrating an embodiment of a method.

According to embodiments of the present invention, techniques including a method for forming substrates are provided. More particularly, embodiments according to the present invention provide a method to form a layer of hard, scratch-resistant layer from a bulk material. In a specific embodiment, the layer of material is provided using a plurality of high energy particles to cause a formation of a cleave plane in the semiconductor substrate. Methods according to embodiments of the invention can be used in a variety of applications, including but not limited to transparent coverings for optical displays, fingerprint or eye biometric scan optical surfaces, optoelectronic devices, semiconductor device packaging, photovoltaic cells, MEMS devices, and others.

According to certain embodiments, beam-induced cleave technology may be used for the preparation of thin sapphire laminated windows. According to particular embodiments, a 20 µm sapphire laminate (c-cut or a-cut) may be bonded to a suitable optical blank. Examples of such optical blanks include but are not limited to, polymers, glass, or quartz. If two-sided sapphire is appropriate, a second sapphire laminate can be bonded to the backside of the blank.

An objective is to substitute a potentially more efficient and cost-effective kerfless wafering technology than current wiresawing approaches. Single crystal sapphire core diameters of 2", 3", 4", 6", 8" and 12" in c-cut, a-cut, m-cut, or r-cut orientations, comprise possible starting crystalline materials.

The above represent some of the main crystallographic orientations of single crystal sapphire. For example, a c-cut crystal means that the large face is parallel (cut) along the c plane where the c-axis is perpendicular to the crystal surface. Off-axis cuts are possible and are usually characterized by a miscut angle from the major crystallographic axes. Accordingly, certain embodiments may comprise material having an orientation corresponding predominantly, but not exactly, to a cut orientation of a major crystallographic axis. Since beam-induced cleaving is a surface referenced method, cleaves will occur at a predefined depth parallel to the crystal face.

Incorporated by reference herein for all purposes, is Azhdari and Nemat-Nasser, "Experimental and computational study of fracturing in an anisotropic brittle solid", *Mechanics of Materials*, Vol. 28, pp. 247-262 (1998). That paper discusses the structure of single crystal sapphire, including the orientations of various possible cleave planes of that bulk material.

Since 1997, Silicon Genesis Corp. ("SiGen") has reported the development and use of cleaving processes utilizing implanted particles (including but not limited to protons). Incorporated by reference herein for all purposes, is U.S. Pat. No. 6,013,563 describing various aspects of certain cleaving processes. Embodiments described herein may share one or more characteristics described in that patent.

According to particular embodiments, a surface of a bulk starting material may be subjected to implantation with accelerated particles, to form a cleave region. In certain embodiments, this cleave region may lie at a depth of between about 10-20 µm underneath the surface of the bulk material. Formation of a cleave region depends upon such factors as the target material, the crystal orientation of the target material, the nature of the implanted particle(s), the dose, energy, and temperature of implantation, and the direction of implantation. Such implantation is discussed further in detail below, and may share one or more characteristics described in detail in connection with the following patent applications, all of which are incorporated by reference in their entireties herein: U.S. patent application Ser. No. 12/789,361; U.S. patent application Ser. No. 12/730,113; U.S. patent application Ser. No. 11/935,197; U.S. patent application Ser. No. 11/936,582; U.S. patent application Ser. No. 12/019,886; U.S. patent application Ser. No. 12/244,687; U.S. patent application Ser. No. 11/685,686; U.S. patent application Ser. No. 11/784,524; U.S. patent application Ser. No. 11/852,088.

Since 2008, SiGen has reported the development and use of a new beam-induced cleave process using a high-energy and high fluence proton beam and a proprietary cleaving system technology to initiate and guide a fracture for efficient kerf-free wafering of a thickness of crystalline material. Incorporated by reference herein for all purposes are the following U.S. Patent Publications describing aspects of certain cleaving processes: 2008/0206962; 2008/0128641; 2009/0277314; and 2010/0055874.

Announced for the preparation of single-crystal silicon solar PV wafers, the process is called PolyMax™ using Direct Film Transfer (DFT) technology. The kerf-free, dry wafering process uses a 2-step implant-cleave method shown in FIG. 1 where high-energy proton irradiation first forms a cleave plane followed by advanced controlled cleaving to initiate and propagate a fracture plane in a controlled manner along the cleave plane to release a large-area wafer from a shaped ingot.

The ion beam-induced cleaving process has been used to demonstrate the slicing of full mono-crystalline silicon wafers ranging in thickness from 20 µm to 150 µm with excellent material quality (electrical, Total Thickness Variation (TTV), surface roughness, mechanical strength).

Figure 2B:
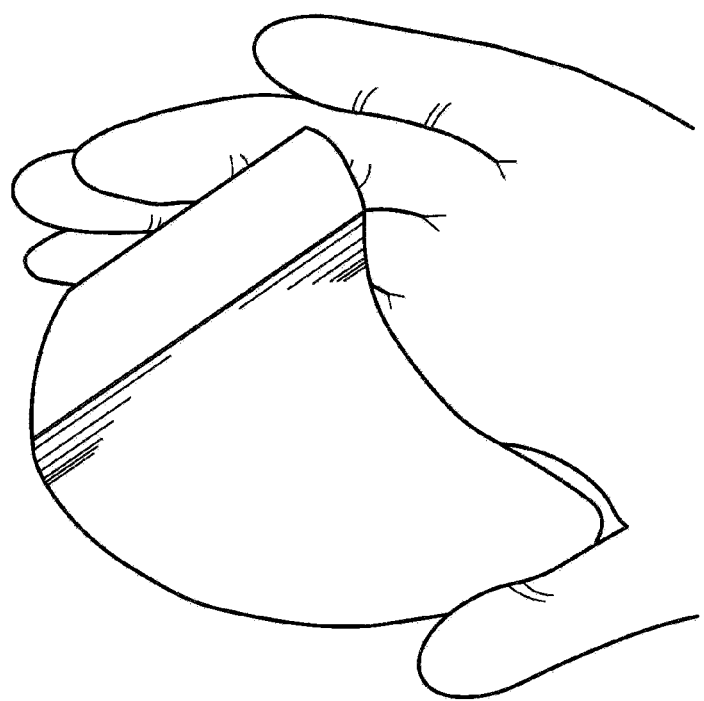
FIG. 2B shows a photo of a 50 µm thick silicon wafer formed according to an embodiment.
Figure 2A:
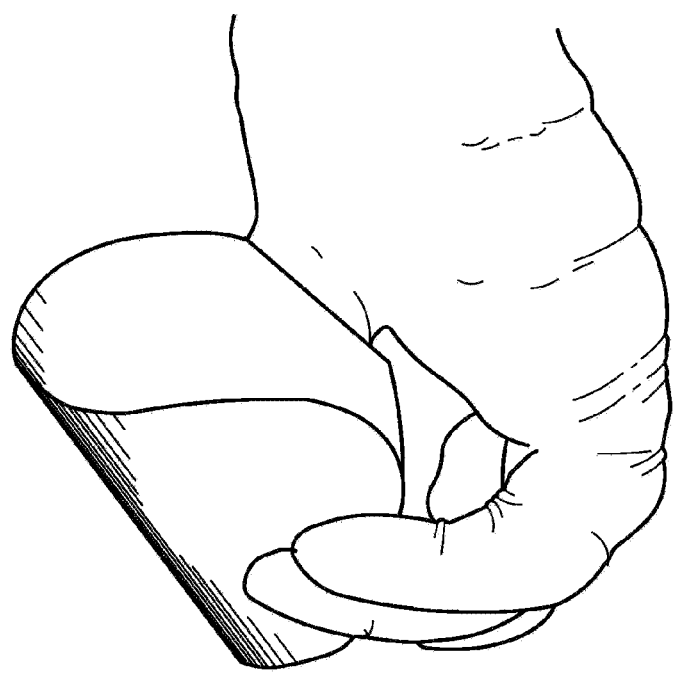
FIG. 2A shows a photo of a 20 µm thick silicon wafer formed according to an embodiment.

FIGS. 2A-2B show 125 mm pseudo-square substrates made using the PolyMax™ process. The substrate of FIG. 2A has a thickness of 20 µm. The substrate of FIG. 2B has a thickness of 50 µm.

A system according to certain embodiments may allow the cleaving of 20 µm to 150 µm thick silicon wafers directly from CZ boules of silicon. However, this technology may also be adapted to kerfless wafering of other types of crystalline bulk materials, including but not limited to sapphire, Group III/V materials such as GaN, SiC, and others.

The higher density of sapphire (3.98 g/cm$^3$) versus that of single crystal silicon (2.3 g/cm$^3$) will lower the cleave depth at a given energy of implanted particle. If adapted to work with sapphire, a DFT system may cleave sapphire wafers between 5-100 µm in thickness. Examples of sapphire layer thicknesses cleaved according to various embodiments include but are not limited to 5 µm, 10 µm, 15 µm, 20 µm, 25 µm, 30 µm, 35 µm, 40 µm, 45 µm, 50 µm, 55 µm, 60 µm, 65 µm, 70 µm, 75 µm, 80 µm, 85 µm, 90 µm, or 100 µm. Greater thicknesses of cleaved materials are possible, depending in part upon the energy to which the implanted particle is able to be accelerated and its stopping range in the target material.

Such a thin layer thickness could be used directly as a lower cost alternative substrate to a 400-600 µm sapphire High-Brightness Light-Emitting Diode (HB-LED) starting substrate. The kerf-free nature of the process in combination with lower sapphire material utilization could substantially lower one of the highest costs in GaN LED manufacturing. The same principle could be applied to SiC and other starting growth substrates.

Figure 3:
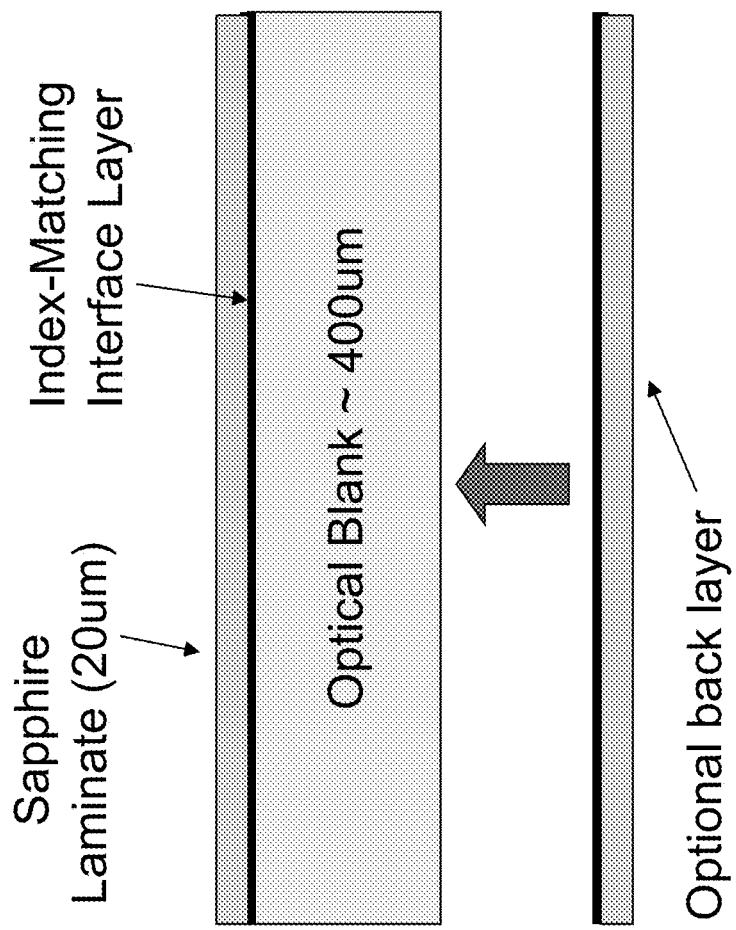
FIG. 3 shows a sapphire laminated optical window according to an embodiment.

In order to create a material having a greater thickness (e.g. 400-600 µm), a laminated structure may be adopted. An embodiment of a proposed laminated structure is shown in FIG. 3. Depending on the particular application, one or two sapphire laminates may be affixed onto an optical blank of approximately 400 µm in thickness.

An index-matching interface layer may be used to affix the laminates onto the blank. The final choice of the optical blank and index-matching interface layer materials can be dependent on the desired use.

For example, depending on the application's temperature range, the interface layer can be an index-matching fluid, epoxy, or some other material. Thus a quartz blank used in a wide temperature range application, may employ an optical index-matched fluid instead of an epoxy. This would allow for differential thermal expansion mismatch, and reduce the possibility of stress-induced fractures. For the quartz example, its large differential thermal expansion mismatch with sapphire would necessitate careful stress engineering and possibly the use of an index matching fluid. Their respective index of refraction would correspond to an internal reflection at the quartz/sapphire interface of less than 1%. If this level is unacceptable for the application, a quarter-wave or dielectric stack matching coating in combination with the index-matching interface layer could be applied to reduce internal reflections to a desirable level.

Figure 4:
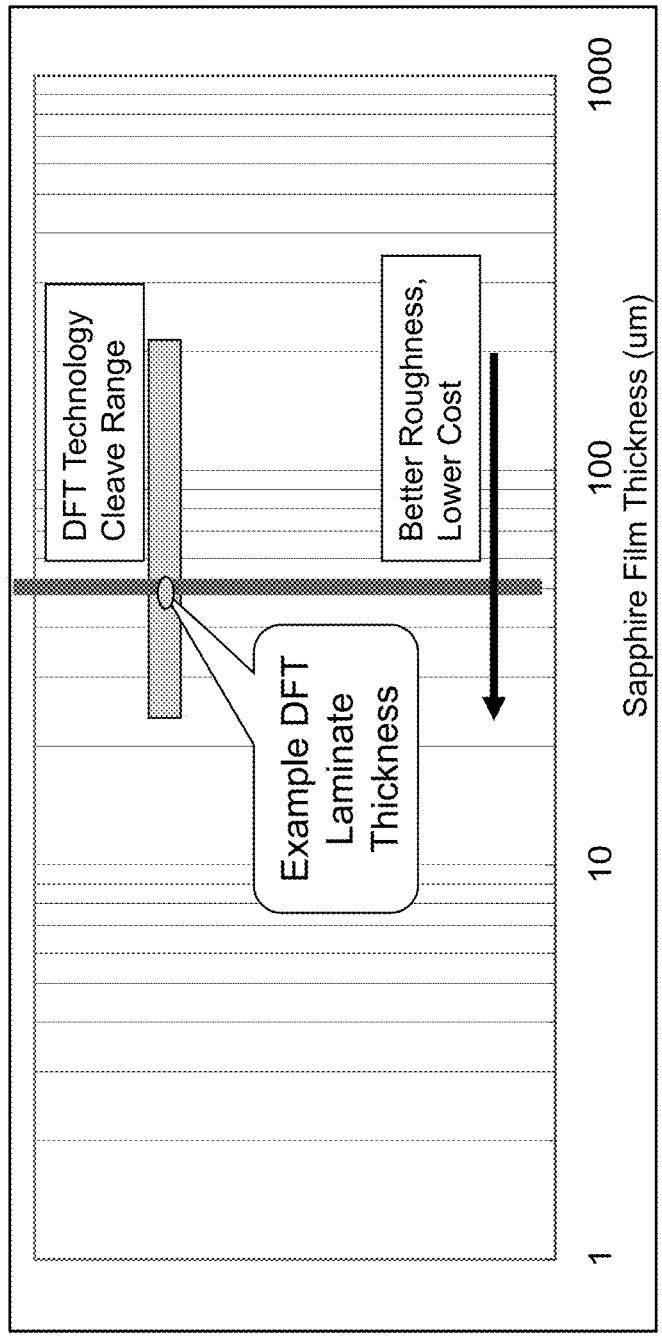
FIG. 4 shows a cleave range for sapphire according to an embodiment.

If a laminated structure is used, FIG. 4 shows cleaving of thinner wafers of about 20 µm in thickness using a lower energy and more compact implanter configuration. The chosen energy is about 1.75 MeV to release approximately 20 µm of material. An operating energy of about 1.75 MeV would allow laminates of 20 µm thickness to be released with little loss of material.

Use of a laminate window according to an embodiment may offer one or more possible benefits versus a solid monolithic sapphire layer. Examples of such possible benefits are provided below.

A laminate window may require much smaller (about 30× less) utilization of relatively expensive sapphire material per window.

The cost of kerf-free wafering is lower on an area basis, and may be especially attractive with larger sapphire core diameters (6" and up).

The TTV of the laminate may be on the order of about +/−0.02 µm. By contrast, a solid sapphire window formed by conventional wiresawing can exhibit a TTV greater than the proposed laminate thickness (>+/−20 µm)

The as-cleaved roughness is expected to be approximately 6 nm Ra. The smoothness of this material would not demand substantial additional polishing steps.

Cost savings may be a function of the area of cleaving, and is estimated in the table of FIG. 5. Using modified implant systems developed for cleaving silicon substrates for the solar photovoltaic industry, costs are estimated to be $0.05/cm$^2$, but can be modified by the packing density of the cores within the scanned implant area of approximately 1 m×1 m.

The 8" and 12" cost range given in FIG. 5 is due to the lower packing density of the large round cores within the implant scan area. The lower number is for a squared core shape. Even with rounded cores, the lower number may be approached using a patterned beam scan that avoids the inter-core gaps. Using a 6" core form factor as an example, the cost comparison between wiresaw and DFT windows can be estimated.

The table of FIG. 5 reflects a number of assumptions, including a core cost of $150/mm, a wiresaw window core use of 600 µm, and a DFT window core use (one side) of 20 µm. Wiresaw cost estimation was based upon: window cost=material cost ($90)+wiresaw cost+rough/fine/touch polish cost. The wiresaw cost would include not only the actual sawing but the various clean and singulation steps.

The DFT cost estimation was based upon: window cost=material cost ($3)+cleave cost ($9)+touch polish cost+ optical blank cost+index-matching interface layer cost. This illustrates the substantial cost reduction potential of the technology.

While the above description has focused upon a single crystal layer of material having a planar shape, this is not required. Alternative embodiments could form a single crystal layer having other than a planar shape. For example, the single crystal layer could be curved in order to match a profile of a lens such as a cylindrical or spherical lens.

The various physical properties of sapphire, as contrasted with other materials, may involve the use of one or more techniques. For example, sapphire exhibits a low emissivity at temperatures below about 800° C. This makes detecting the temperature of the bulk material during processing steps such as implant and/or cleaving, difficult at lower temperatures.

Figure 6:
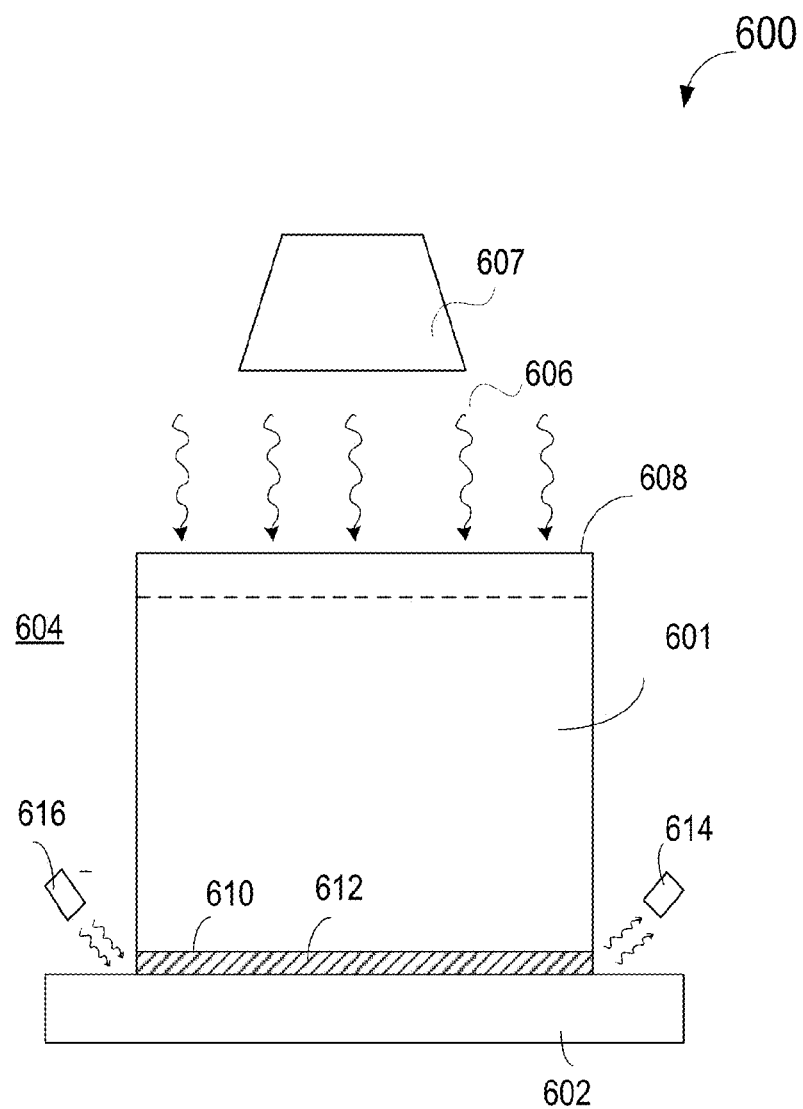
FIG. 6 shows a simplified view of an embodiment of a rig 600 for processing sapphire.

Accordingly, FIG. 6 shows a simplified view of an embodiment of a rig 600 for processing sapphire. In particular, the bulk sapphire core 601 is supported by process chuck 602 within vacuum chamber 604. Beam 606 of accelerated particles from source 607 is implanted into the top surface 608 of the sapphire core.

On its bottom surface 610, the core bears a coating 612 comprising a material whose emissivity renders it suitable for thermal measurement over the full range of temperatures expected to be experienced during processing. Examples of such coatings include but are not limited to metal or carbon. Accordingly the process rig also includes a thermal detector 614 in communication with the coating.

The emissive coating 612 may perform functions other than temperature detection. For example, the coating may allow thermal control over the bulk material by radiative cooling.

Indeed, such radiative cooling by a coating may offer a practical cooling mechanism available to a sapphire core undergoing processing (such as particle implantation) at temperatures of about 650-850° C. Specifically as implantation is performed in a vacuum environment, cooling by convection is not an option. Moreover, the chuck may be selected to not have an appreciable cooling path for the sapphire core undergoing implantation, thereby substantially reducing or eliminating entirely the possibility of cooling the sapphire core via conduction. If the implant heat flux is matched to the coating's radiation cooling flux when the implant surface reaches the desired implant temperature, the coating can serve to control the implant at high temperatures without additional complex and costly cooling methods.

U.S. Pat. No. 6,458,723 titled "High Temperature Implant Apparatus", is hereby incorporated by reference in its entirety for all purposes. One or more concepts disclosed in that patent may find use according to various embodiments here. It is noted that depending upon the particular material and the specific conditions under which implantation occurs, the temperature could lie in a range between about 50-900° C. For implantation of sapphire, the temperature range at implantation may range between about 650-850° C.

Still another function that may be performed by a coating due to its absorptive nature for heating the sapphire for annealing and cleaving. Specifically, once particles have been introduced by implantation, additional energ(ies) may need to be applied in order to permit initiation and/or propagation of the cleaving process. In certain embodiments, such energ(ies) may be provided in the form of luminance, with the coating serving to absorb the applied light and convert it into the thermal energy responsible for cleave initiation and/or propagation.

Accordingly, the process rig may further comprise a source 616 of electromagnetic radiation, which may be applied to the coating. Examples of such sources include but are not limited to lamps such as QTH (Quartz Tungsten Halogen) flashlamps and lasers.

It is further noted that certain electrical properties of sapphire may dictate its being subjected to implantation at elevated temperatures. Specifically, the electric field breakdown strength of sapphire at room temperature may be insufficient to withstand the high buildup of local electrical fields resulting from the implantation of charged particles, without exceeding a breakdown electric field strength ($E_{BD}$). However it is known that the resistivity ($\rho$) of sapphire decreases with increasing temperature (approximately 1×10$^{16}$ Ω-cm at room temperature to 1×10$^6$ Ω-cm at 1000° C.), and thus material breakdown can be avoided by increasing the temperature until the following equation is satisfied:

$$\rho(T) < E_{BD}/I_a$$

where $I_a$ is the current per area being implanted in amperes/cm$^2$

Given an estimated sapphire $E_{BD}$ of about 4.8×10$^5$V/cm and an implant flux of 2.5 µA/cm$^2$, the maximum resistivity permitted to avoid material breakdown is about 2×10$^{11}$ Ω-cm. This resistivity occurs at about 500° C., therefore it is expected that increasing the temperature of a sapphire core above 500° C. prior to commencing implantation may be useful to avoid breakdown of the material. Accordingly, it may be desirable to employ a coating for the purpose of radiative heating of the sapphire core prior to its implantation with charged particles for this purpose.

Certain thermo-mechanical properties of a sapphire core may enhance its ability to be cleaved into individual layers according to various embodiments. Specifically, within its expected implantation temperature range (e.g. 650-850° C.), sapphire also exhibits a relatively high coefficient of thermal expansion, together with a relatively low degree of thermal conductivity. Furthermore, the application of accelerated particles for implantation may occur as a scanned beam, with a relative dwell time at any point of as little as 80 µs.

The resulting rapid pulse heating of sapphire is contained near surface areas of the core receiving the beam by the sapphire's low thermal conductivity. Accordingly, at temperatures of about 800° C., regions of a few tens of microns proximate to the implanted surface of the core will be expected to undergo repeated thermal expansion, followed by rapid contraction as excess heat is removed by conductive cooling to the rest of the sapphire bulk. The resulting stresses in the surface regions of the implanted core may serve to provide energy for cleave initiation and/or propagation.

For example, using a 2 cm beam of 15 kW power scanned over a 50 cm×50 cm area with a beam velocity of 250 m/s, a thickness of about 30 μm beneath the implant surface undergoes a temperature rise of about 70° C. within 80 μs. This is followed by cooling to bulk temperature within a few milliseconds. During that brief time, surface compressive shear stresses exceeding 150-200 MPa are developed that can augment the cleave plane chemical stresses to help prepare the implanted layer for cleaving.

Although the above description has been primarily in terms of a sapphire bulk material, other substrates may also be used. For example, the substrate can be almost any monocrystalline, polycrystalline, or even amorphous type substrate. One example of a suitable material is silicon carbide (SiC). Additionally, the substrate can be made of III/V materials such as gallium arsenide (GaAs), gallium nitride (GaN), and others. A multi-layered substrate can also be used according to various embodiments. The multi-layered substrate includes a silicon-on-insulator substrate, a variety of sandwiched layers on a semiconductor substrate, and numerous other types of substrates.

Embodiments may employ pulsed energy in addition to, or in place of, scanned energy, to initiate or propagate a controlled cleaving action. The pulse can be replaced or supplemented by energy that is scanned across a selected region of the substrate to initiate the controlled cleaving action. Energy can also be scanned across selected regions of the substrate to sustain or maintain the controlled cleaving action. One of ordinary skill in the art would easily recognize a variety of alternatives, modifications, and variations, which can be used according to the present invention.

While the above is a full description of the specific embodiments, various modifications, alternative constructions and equivalents may be used. Although the above has been described using a selected sequence of steps, any combination of any elements of steps described as well as others may be used. Additionally, certain steps may be combined and/or eliminated depending upon the embodiment. Furthermore, the particles of hydrogen can be replaced using co-implantation of helium and hydrogen ions or deuterium and hydrogen ions to allow for formation of the cleave plane with a modified dose and/or cleaving properties according to alternative embodiments. Still further, the particles can be introduced by a diffusion process rather than an implantation process. Of course there can be other variations, modifications, and alternatives. Therefore, the above description and illustrations should not be taken as limiting the scope of the present invention which is defined by the appended claims.

What is claimed is:

1. A method comprising:
   forming a coating on an external surface of a bulk single crystal material;
   implanting a plurality of particles into a surface of a bulk single crystal material at between 650-850° C. to form a cleave region, such that the coating performs radiative cooling; and
   performing a controlled cleaving process to separate a cleaved single crystal layer from the bulk single crystal material along the cleave region,
   wherein the bulk single crystal material comprises sapphire, and the cleaved single crystal layer comprises a cleaved single crystal sapphire layer having a thickness of between 5-100 μm;
   wherein the implanting comprises accelerating protons from a particle accelerator into the surface of the bulk single crystal sapphire material to form a sub-surface cleave region, and
   performing the controlled cleaving comprises applying energy in a spatially varying manner to cause controlled cleaving of the bulk single crystal sapphire material propagated in a direction along the sub-surface cleave region to produce a cleaved single crystal sapphire layer with a Total Thickness Variation (TTV) on the order of +/−0.02 μm;
   providing the cleaved single crystal sapphire layer without additional polishing steps; providing a quartz optical blank;
   providing an index matching material positioned between the cleaved single crystal sapphire layer and the optical blank to form an optical laminate, an internal reflection at a quartz/sapphire interface being below 1%;
   providing a quarter-wave matching coating to further reduce the internal reflection; and
   disposing a second index matching material on an opposite side of the optical blank from the cleaved single crystal sapphire layer, between the optical blank and a second cleaved single crystal sapphire layer.

2. A method as in claim 1 further comprising incorporating the cleaved single crystal sapphire layer in a display screen.

3. A method as in claim 1 further comprising incorporating the cleaved single crystal sapphire layer in a biometric recognition device.

4. A method as in claim 1 further comprising incorporating the optical laminate in a display screen.

5. A method as in claim 1 further comprising incorporating the optical laminate in a biometric recognition device.

6. A method as in claim 1 wherein the cleaved single crystal sapphire layer comprises c-cut oriented material.

7. A method as in claim 1 wherein the cleaved single crystal sapphire layer comprises a-cut oriented material.

8. A method as in claim 1 wherein the cleaved single crystal sapphire layer comprises m-cut oriented material.

9. A method as in claim 1 wherein the cleaved single crystal sapphire layer comprises r-cut oriented material.

10. A method as in claim 1 wherein the cleaved single crystal sapphire layer is characterized by a miscut angle from a major crystallographic axis.

11. A method as in claim 1 wherein the energy comprises a scanned beam.

12. A method as in claim 1 further comprising:
   detecting a temperature during the implanting; and
   controlling an implant heat flux according to the temperature.

13. A method as in claim 1 wherein the energy comprises luminance absorbed by the coating.

14. A method as in claim 1 wherein the coating consists essentially of carbon.

* * * * *